United States Patent
Singh et al.

(10) Patent No.: US 11,682,453 B2
(45) Date of Patent: *Jun. 20, 2023

(54) WORD LINE PULSE WIDTH CONTROL CIRCUIT IN STATIC RANDOM ACCESS MEMORY

(71) Applicant: Taiwan Semiconductor Manufacturing Company Limited, Hsinchu (TW)

(72) Inventors: Anjana Singh, Hsinchu (TW); Cheng Hung Lee, Hsinchu (TW); Hau-Tai Shieh, Hsinchu (TW); Yi-Tzu Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/363,190

(22) Filed: Jun. 30, 2021

(65) Prior Publication Data

US 2021/0327499 A1 Oct. 21, 2021

Related U.S. Application Data

(63) Continuation of application No. 16/874,789, filed on May 15, 2020, now Pat. No. 11,056,182, which is a continuation of application No. 15/969,834, filed on May 3, 2018, now Pat. No. 10,658,026.

(60) Provisional application No. 62/511,537, filed on May 26, 2017.

(51) Int. Cl.
*G11C 8/08* (2006.01)
*G11C 11/418* (2006.01)

(52) U.S. Cl.
CPC .............. *G11C 11/418* (2013.01); *G11C 8/08* (2013.01)

(58) Field of Classification Search
CPC ........ G11C 11/418; G11C 8/08; G11C 11/413
USPC .................................................. 365/154, 205
See application file for complete search history.

(56) References Cited

U.S. PATENT DOCUMENTS

| 4,042,915 A | 8/1977 | Reed |
| 4,706,218 A * | 11/1987 | Sodd ........................ G11C 8/06 365/233.5 |
| 4,800,552 A * | 1/1989 | Koshizuka ............... G11C 7/22 365/230.03 |
| 5,018,107 A | 5/1991 | Yoshida |
| 5,457,412 A | 10/1995 | Tamba et al. |
| 5,600,589 A | 2/1997 | Ishigaki et al. |

(Continued)

FOREIGN PATENT DOCUMENTS

KR 2014133137 A * 11/2014 ............... G11C 8/10

*Primary Examiner* — Michael T Tran
(74) *Attorney, Agent, or Firm* — Jones Day

(57) ABSTRACT

Devices and methods are provided for word line pulse width control for a static random access memory (SRAM) devices. A control circuit includes a first transistor, an inverter coupled to the first transistor, and a second transistor comprising a gate, a first source/drain terminal and a second source/drain terminal. The second transistor is coupled to the inverter. The first source/drain terminal of the second transistor is coupled in series to the first transistor. The second source/drain terminal is coupled to a decoder driver circuit. The second transistor is configured to charge a load of a common decoder line so as to reduce an effective load of the decoder driver circuit.

20 Claims, 6 Drawing Sheets

(56) References Cited

U.S. PATENT DOCUMENTS

| | | | |
|---|---|---|---|
| 5,764,565 A | 6/1998 | Sato et al. | |
| 5,793,695 A | 8/1998 | Kohno | |
| 5,923,815 A | 7/1999 | Park | |
| 5,953,249 A | 9/1999 | van der Wagt | |
| 6,043,540 A | 3/2000 | Matsui et al. | |
| 6,104,631 A | 8/2000 | El-Sharawy et al. | |
| 6,339,817 B1 | 1/2002 | Maesako et al. | |
| 6,384,623 B1 | 5/2002 | Sakata et al. | |
| 6,590,800 B2 | 7/2003 | Chang | |
| 6,856,574 B2* | 2/2005 | Iwahashi | G11C 7/222 365/194 |
| 6,901,006 B1 | 5/2005 | Kobayashi et al. | |
| 7,072,236 B2* | 7/2006 | Matsuoka | G11C 16/28 365/207 |
| 7,619,402 B1 | 11/2009 | Kwong | |
| 7,768,813 B2* | 8/2010 | Terzioglu | G11C 7/1069 365/207 |
| 8,050,082 B2 | 11/2011 | Lee | |
| 8,498,174 B2 | 7/2013 | Chiu et al. | |
| 8,693,264 B2* | 4/2014 | Chand Sk | G11C 7/065 365/207 |
| 8,913,419 B2* | 12/2014 | Takemura | G11C 11/4063 365/207 |
| 8,917,547 B2 | 12/2014 | Cai et al. | |
| 9,046,573 B1 | 6/2015 | Watt | |
| 9,236,113 B2 | 1/2016 | Holla et al. | |
| 9,997,236 B1 | 6/2018 | Pathak | |
| 2001/0000693 A1 | 5/2001 | Hamamoto et al. | |
| 2001/0009382 A1* | 7/2001 | DeSoto | G11C 8/08 326/106 |
| 2001/0052794 A1 | 12/2001 | Hidaka | |
| 2002/0080677 A1 | 6/2002 | Watanabe et al. | |
| 2002/0186610 A1 | 12/2002 | Benedix et al. | |
| 2003/0112668 A1 | 6/2003 | Takahashi et al. | |
| 2003/0156485 A1 | 8/2003 | Tomita et al. | |
| 2003/0198121 A1 | 10/2003 | Kuroda | |
| 2004/0022098 A1 | 2/2004 | Hatanaka et al. | |
| 2004/0080970 A1 | 4/2004 | Kokubo et al. | |
| 2006/0050584 A1 | 3/2006 | Gogl et al. | |
| 2006/0198231 A1* | 9/2006 | Larguier | G11C 11/413 365/230.06 |
| 2007/0030741 A1 | 2/2007 | Nii et al. | |
| 2007/0127298 A1 | 6/2007 | Yamamura | |
| 2008/0037355 A1 | 2/2008 | Hirabayashi | |
| 2008/0130379 A1 | 6/2008 | Ohsawa | |
| 2008/0189491 A1 | 8/2008 | Oh | |
| 2008/0252356 A1 | 10/2008 | Oike | |
| 2008/0264170 A1 | 10/2008 | Abbott | |
| 2009/0090973 A1 | 4/2009 | Tohata et al. | |
| 2009/0109785 A1 | 4/2009 | Houston et al. | |
| 2009/0168557 A1* | 7/2009 | Agarwal | G11C 8/08 365/189.11 |
| 2009/0273964 A1 | 11/2009 | Yamazaki et al. | |
| 2010/0103725 A1* | 4/2010 | Kim | G11C 13/0026 365/205 |
| 2010/0296337 A1 | 11/2010 | Houston | |
| 2011/0113187 A1 | 5/2011 | Kashiwagi | |
| 2012/0120717 A1 | 5/2012 | Sekigawa et al. | |
| 2012/0307550 A1 | 12/2012 | Yu et al. | |
| 2013/0041481 A1 | 2/2013 | Seberger | |
| 2013/0221987 A1 | 8/2013 | Cranford, Jr. et al. | |
| 2013/0286763 A1 | 10/2013 | Wang | |
| 2013/0329511 A1 | 12/2013 | Ramamurthy et al. | |
| 2014/0010032 A1 | 1/2014 | Seshadri et al. | |
| 2014/0016404 A1 | 1/2014 | Kim et al. | |
| 2014/0169074 A1 | 6/2014 | Sinha et al. | |
| 2014/0269115 A1 | 9/2014 | Hua et al. | |
| 2015/0092477 A1 | 4/2015 | Chiou et al. | |
| 2015/0098267 A1 | 4/2015 | Jain et al. | |
| 2015/0213881 A1 | 7/2015 | Rai et al. | |
| 2015/0227669 A1 | 8/2015 | Joshi et al. | |
| 2015/0269995 A1 | 9/2015 | Kajigaya | |
| 2015/0332755 A1 | 11/2015 | Singh et al. | |
| 2016/0064069 A1 | 3/2016 | Menezes et al. | |
| 2016/0093364 A1 | 3/2016 | Jung et al. | |
| 2016/0211838 A1 | 7/2016 | Fan et al. | |
| 2016/0240231 A1* | 8/2016 | Arvapalli | G11C 8/10 |
| 2016/0254045 A1 | 9/2016 | Mazumder et al. | |
| 2017/0301396 A1 | 10/2017 | Dhori et al. | |
| 2017/0372772 A1 | 12/2017 | Katoch et al. | |
| 2018/0040366 A1 | 2/2018 | Sinangil et al. | |
| 2018/0059975 A1 | 3/2018 | Samson et al. | |
| 2018/0174646 A1 | 6/2018 | Luo et al. | |
| 2019/0006424 A1 | 1/2019 | Kwon et al. | |
| 2019/0066772 A1* | 2/2019 | Singh | G11C 11/418 |
| 2019/0172503 A1 | 6/2019 | Takeda et al. | |
| 2019/0293716 A1 | 9/2019 | Yokoyama | |
| 2019/0385644 A1 | 12/2019 | Kang et al. | |
| 2020/0105353 A1* | 4/2020 | Sharon | G11C 29/021 |
| 2020/0168278 A1 | 5/2020 | Tang et al. | |
| 2020/0192570 A1* | 6/2020 | Giaccio | G11C 29/022 |
| 2020/0357455 A1 | 11/2020 | Noack et al. | |
| 2021/0065785 A1 | 3/2021 | Chong et al. | |
| 2021/0241845 A1* | 8/2021 | Li | G11C 29/42 |
| 2021/0272003 A1* | 9/2021 | Rigetti | G06F 15/16 |
| 2021/0407455 A1* | 12/2021 | Li | G09G 3/32 |
| 2021/0407613 A1* | 12/2021 | Eliash | G11C 29/42 |

* cited by examiner

WORD LINE PULSE WIDTH CONTROL CIRCUIT IN STATIC RANDOM ACCESS MEMORY

PRIORITY CLAIM

The present application is a continuation application of U.S. patent application Ser. No. 16/874,789, now U.S. Pat. No. 11,056,182, filed May 15, 2020, which is a continuation application of U.S. application Ser. No. 15/969,834, now U.S. Pat. No. 10,658,026, filed May 3, 2018, which claims priority to U.S. Application No. 62/511,537, filed May 26, 2017, the content of which are incorporated by reference herein in their entireties.

FIELD

The technology described in this disclosure relates generally to electronic devices and more particularly to memory devices.

BACKGROUND

Static random access memory (SRAM) devices are widely used for electronic applications where high speed and low power consumption are desired. SRAM devices are typically made up of one or more SRAM cells implemented using transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
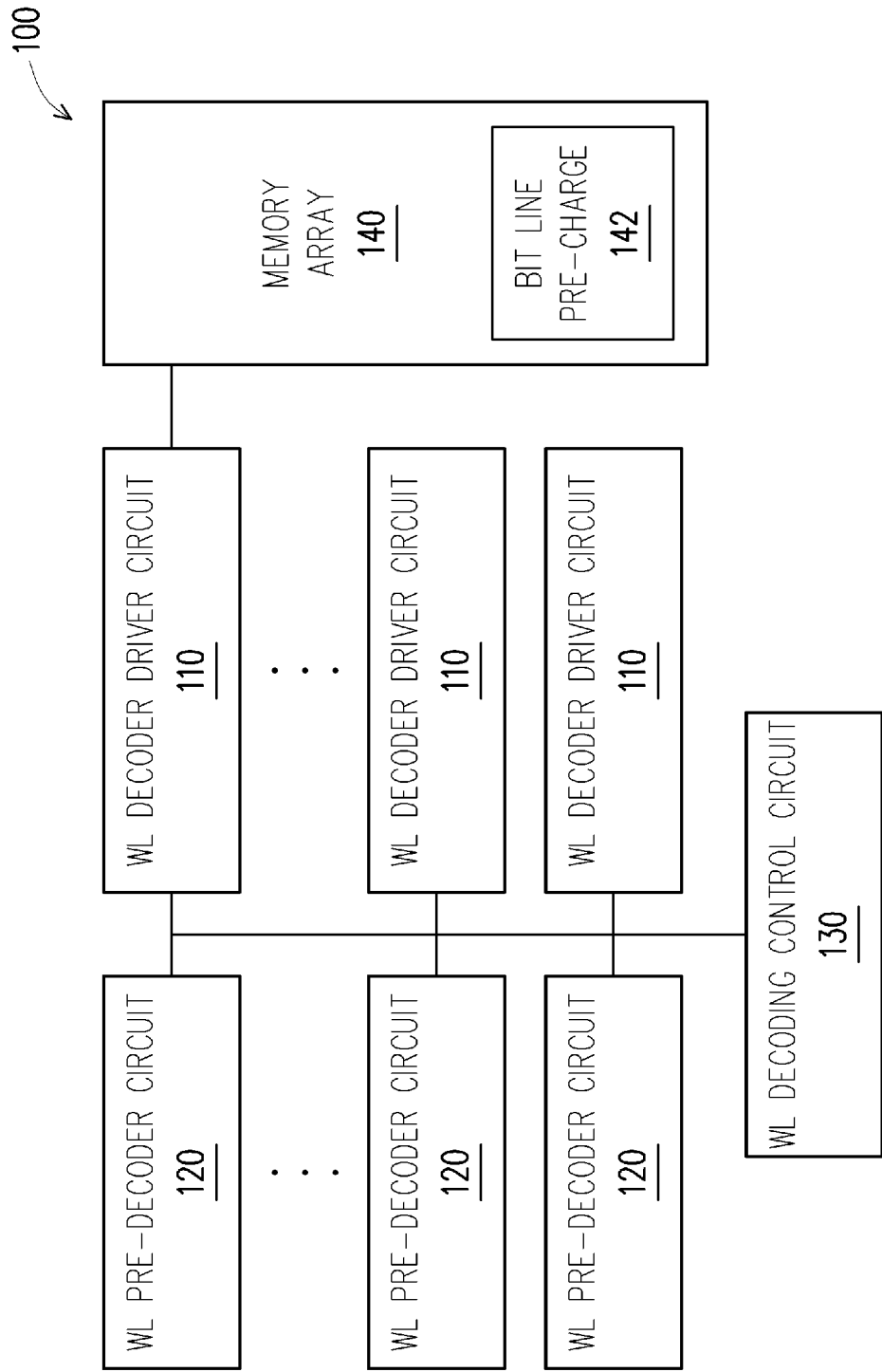
FIG. 1 depicts an example diagram of a SRAM decoding device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

SRAM devices can be made up of one or more SRAM cells. SRAM cells can include different numbers of transistors. The transistors can form a data latch for storing a data bit. Additional transistors may be added to control the access to the transistors. SRAM cells can be arranged as an array having rows and columns. Typically, each row of the SRAM cells is connected to a word-line (WL), which determines whether the current SRAM cell is selected or not. Each column of the SRAM cells is connected to a bit-line (BL) or pair of BLs (BL/BLB), which is used for storing a data bit into a selected SRAM cell or reading a stored data bit from the selected SRAM cell.

A static noise margin (SNM) is an SRAM parameter that indicates how well an SRAM memory cell can maintain a logic state "0" or "1" when the SRAM memory cell is perturbed by noise or with intrinsic imbalance. For example, such noise or intrinsic imbalance can occur between cross-coupled inverters or result from leakage defects within transistors. Due to different voltage levels of WL and BL-pairs, a dual rail SRAM needs to avoid power noise such as VDD to VDDM peripheral boundary and/or intrinsic imbalance. In order to avoid power noise, the WL should turn off before the BLPCH turns off. This can be achieved by a WL decoding scheme, as described herein, which increases the speed at which the WL turns ON and OFF. The SNM is a more severe issue in cases where VDDM and VDD are at different voltage levels. When VDDM is lower than VDD, the WL pulse width is bigger than the BLPCH pulse width. In other words, the WL takes longer to charge to a steady state voltage. The subject matter described herein addresses such power race condition in dual rail SRAM devices and adds substantially no cycle time.

FIG. 1 depicts an example diagram of SRAM decoding logic 100 in accordance with some embodiments. SRAM decoding logic 100 can be applied to a dual rail SRAM device. SRAM decoding logic 100 can include a plurality of WL decoder driver circuits 110, a plurality WL pre-decoder circuits 120, a WL decoding control circuit 130, and a memory array 140. The pre-decoded word-line is transmitted to the respective WL decoder driver circuit 110 coupled to the WL pre-decoder circuit 120. The WL pre-decoder circuits 120 and the WL decoder driver circuits 110 are collectively coupled together by a common WL decoding control circuit 130. The WL pre-decoder circuits 120 and the WL decoder driver circuits 110 has a WL output coupled to the memory array 140 to enable a read/write operation. WL pre-decoder circuits 120 and WL decoder driver circuits 110 can drive a respective WL coupled to the memory array 140 so that the proper memory cell in the memory array 140 is accessed.

Each memory array 140 includes one or more word-lines (WL/WLB) and one or more bit-lines (BL/BLB), arranged in rows and columns (not shown). WL decoder driver circuit 110 drives the one or more WL/WLB within memory array 140. One or more BLs can be interconnected with bit line pre-charge 142 circuitry. At least one bit line pre-charge 142 can be located in memory array 140. Bit line pre-charge 142 pre-charges connected BL/BLB for various operations of memory array 140 (e.g., read/write operations). For example, bit line pre-charger 142 can include at least two PMOS transistors, with at least one PMOS transistor coupled to BL and at least one PMOS transistor coupled to BLB. Memory array 140 can also include, for example, row decoders and/or column decoders (not shown) to provide WL decoding by row address and BL selections by column address to particular rows and/or columns. Each read/write operation turns on one WL and the column-selected BLs will read-out or write-in data to memory array 140.

At the end of a read/write cycle using SRAM decoding logic 100, two separate events can occur. Specifically, a selected WL is turned off and the BL pre-charge (BLPCH) 142 is turned on. Depending on the sequence of these two events, SNM can be generated and/or increased due to power levels of the accessed and unaccessed bit cells of a selected row. That is, a bit cell power race condition occurs for a period of time between when the BLPCH 142 is in an OFF state and when the WL is still in an ON state. In one example, a WL of SRAM decoding logic 100 is driven by a supply voltage, VDDM, whereas the BL is driven by a periphery supply voltage, VDD. When VDD is substantially larger than VDDM, WL decoder driver circuit 110 can see a large, effective device load. This can cause a delay in turning off the WL while the BLPCH 142 is turned on. Such a delay generates and/or increases a SNM of the SRAM decoding logic 100 due to capacitive coupling associated with one or more transistors of memory array 140.

Figure 2:
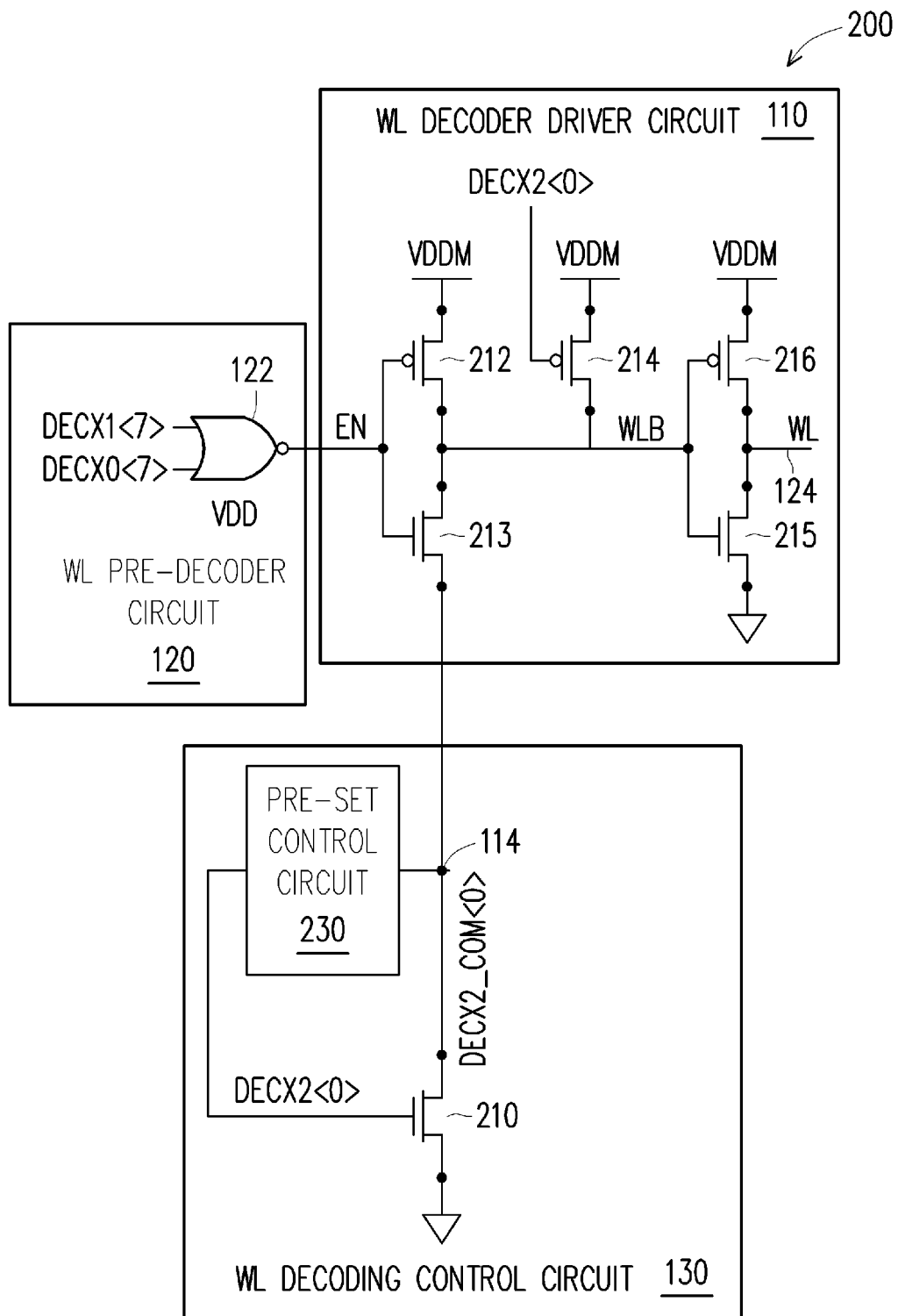
FIG. 2 depicts an example diagram of a WL decoding scheme for the SRAM device shown in FIG. 1 in accordance with some embodiments.

FIG. 2 depicts an example diagram of example WL decoding scheme 200 within the SRAM decoding logic 100 of FIG. 1 in accordance with some embodiments. For the purposes of the subject matter described herein, as known in the art, it is noted that NMOS and PMOS transistors have three operational modes which include weak-inversion mode, triode mode, and active mode. Additionally, NMOS and PMOS transistors have associated threshold voltages. The threshold voltage, $V_T$, defines a minimum amount of voltage required across the gate terminal and source terminal to create current flow between a source terminal and a drain terminal of the transistor. Threshold voltages associated with NMOS transistors are positive voltages (e.g., ~0.8V in some embodiments) and threshold voltages associated with PMOS transistors are negative voltages (e.g., ~−0.8V in some embodiments). In weak-inversion mode, NMOS and PMOS transistors are in an OFF state when the voltage measured between a gate terminal and a source terminal, $V_{GS}$ or $V_{SG}$, is less than or equal to the absolute value of a threshold voltage associated with the respective transistor. In other words, NMOS transistors are in an OFF state when the following expression is satisfied:

$$V_{GS} \le |V_T| \tag{1}$$

and PMOS transistors are in an OFF state when the following expression is satisfied:

$$V_{SG} \le |V_T| \tag{2}$$

When in an OFF state, the NMOS and PMOS transistors provide no electrical conduction between a drain terminal and a source terminal and the transistor is equivalent to a switch in an OFF state.

In triode mode, the NMOS and PMOS transistors are an ON state when (i) a voltage measured between a gate terminal and a source terminal is greater than or equal to an absolute value of a threshold voltage associated with the transistor and (ii) the difference between a voltage measured across a gate terminal and a source terminal and a threshold voltage is greater than or equal to a voltage measure across a drain terminal and a source terminal, $V_{DS}$ or $V_{SD}$. In other words, an NMOS transistor is in an ON state in triode mode when the following expressions are satisfied:

$$V_{GS} > |V_T| \tag{3}$$

and $$V_{DS} \le V_{GS} - |V_T|. \tag{4}$$

A PMOS transistor is in an ON state in triode mode when the following expressions are satisfied:

$$V_{SG} > |V_T| \tag{5}$$

and $$V_{SD} \le V_{SG} - |V_T|. \tag{6}$$

When in an ON state, the transistor allows current to flow between the drain terminal and the source terminal.

In active mode, the transistor is in an ON state when (i) the voltage measured between a gate terminal and a source terminal is greater than the threshold voltage and (ii) the voltage measured between a gate terminal and a drain terminal is greater than a difference between a voltage measured between a gate terminal and a source terminal and the threshold voltage. In other words, a NMOS transistor is in an ON state when Equation (3) and the following are satisfied:

$$V_{DS} > V_{GS} - |V_T|. \tag{7}$$

A PMOS transistor is in an ON state when Equation (5) and the following are satisfied:

$$V_{SD} > V_{SG} - |V_T|. \tag{8}$$

WL decoding scheme 200 can determine controller operations of SRAM decoding logic 100, such as, read/write operations, addressing pre-decoding for word line drivers, chip enabling/disabling, self timing generations, and/or other operations associated with main input/output array communications. Components of WL decoding scheme 200 can be dispersed throughout SRAM decoding logic 100. In accordance with some embodiments, WL decoding scheme 200 can include WL decoding control circuit 130, WL pre-decoder circuit 120, and WL decoder driver circuit 110. WL decoder driver circuit 110 can include one or more PMOS transistors 212, 214, and 216 and one or more NMOS transistors 213, 215 coupled to one or more WLs 124. Data (e.g., address locations to enable read/write operations) on the WLs can be decoded by WL pre-decoder circuit 120. WL pre-decoder circuit 120 can include one or more decoders 122. Decoder 122 is electrically coupled to a periphery supply voltage, VDD. Additionally, one or more BLs (not shown in FIG. 2) are also electrically coupled to a periphery supply voltage, VDD. A common NMOS transistor 210 is electrically coupled to the common node 114 of WL decoding control circuit 130. A common decoder line (e.g., DECX2_COM<0>) interconnects the WL pre-decoder circuits 120 and WL decoder driver circuits 110 at a common node 114. Common node 114 is a common connection point for electrical components within the WL pre-decoder circuits 120 and WL decoder driver circuits 110. A WL decoding control circuit 130 electrically interconnects with common node 114 to reduce an effective load of WL decoder driver circuit 110. The effective load measured at common node 114 is electrically reduced. Common NMOS transistor 210 is electrically coupled to one or more WL decoder driver circuits 110. The gate terminals of PMOS transistors 212, 214 and NMOS transistors 213, 215 receive inputs with address signals from memory array 140 (e.g., clocked address DECX2<0> which is a pulse signal triggered by a clock for every clock cycle). The gate terminals of PMOS transistor 216 and NMOS transistor 215 are coupled to a source/drain terminal of PMOS transistor 212, 214 and NMOS transistor 213. PMOS transistors 212, 214, 216 are electrically coupled to a voltage, VDDM.

When the supply voltage, VDDM, for the WLs 124 is substantially lower than the periphery supply voltage for the BL, absent pre-set control circuit 230 (e.g., VDDM=~0.54V and VDD=~0.675V in some embodiments), the output of decoder 122, EN, is high which produces a substantial voltage level (e.g., satisfying Equations (3), (4), and/or (7)). The output of decoder 122, EN, is coupled to the gate terminals of PMOS transistor 212 and NMOS transistor 213. A source/drain terminal of PMOS transistor 212 is coupled to VDDM (e.g., ~0.54V in some embodiments) which has a substantially lower voltage than the voltage at EN. The difference between the source/drain terminal voltage, VDD, and the gate terminal voltage, VDDM, results in a positive voltage (e.g., $V_{SG-222}$), satisfying Equation (2) for PMOS transistor 212. As a result, PMOS transistor 212 is in an OFF state. A source/drain terminal of PMOS transistor 212 is electrically coupled to a source/drain terminal of NMOS transistor 213. With PMOS transistor 212 in an OFF state, the voltage across the gate terminal and source terminal of NMOS transistor 213, $V_{GS-213}$, is approximately substantially high (e.g., satisfying Equations (3), (4), and/or (7)). As a result, NMOS 213 is in an ON state. DECX2<0> is a pulse signal generated by a clock which is triggered every clock cycle time. When DECX2<0> is low (e.g., 0V in some embodiments), the voltage across the gate terminal and the source/drain terminal coupled to VDDM of PMOS transistor 214, $V_{GS-214}$, satisfies either Equations (5), (6), and/or (8). As a result, PMOS transistor 214 is in an ON state and WLB is high due to current flow between the gate terminal and source/drain terminals of PMOS transistor 214. Gate terminals of PMOS transistor 216 and NMOS transistor 215 are coupled to WLB. With a high gate voltage substantially higher than VDDM, Equation (2) is satisfied for PMOS transistor 216 and PMOS transistor 216 is in an OFF state. A source/drain terminal of PMOS 216 is electrically coupled to a source/drain terminal of NMOS transistor 215. With a high voltage on the gate terminal of NMOS transistor 215 and a low source/drain voltage, Equations (3), (4), and/or (7) are satisfied and NMOS transistor is in an ON state. With DECX2<0> low, the gate voltage of NMOS transistor 210 is approximately 0V. With no gate voltage, Equation (1) is satisfied for NMOS transistor 210. As a result, NMOS transistor 210 is in an OFF state. With PMOS transistors 212, 216 and NMOS transistor 210 in an OFF state and NMOS transistors 213, 215 and PMOS transistors 214 in an ON state, absent pre-set control circuit 230, the effective load of PMOS transistor 214 can include, for example, a resistive-capacitive (RC) load on WLB, the device load of NMOS transistor 215, the device load of PMOS transistor 216, the device load of NMOS transistor 213, and/or the RC load of the common node 114. PMOS transistor 214 is in an ON state, which charges WLB to a high voltage (e.g., VDDM) slowly, with an increased effective load seen by PMOS transistor 214. NMOS transistor 213 is in an ON state with the RC load of the common node 114. Since NMOS transistor 213 is ON and has a larger voltage across its gate and source terminals, $V_{GS-213}$, than the voltage across the gate and source terminals of PMOS transistor 214, $V_{SG-214}$, and the RC load at common node 114 is so large, the slope of WLB is degraded and the WL 124 falling edge is extended which generates and/or increases the SNM. This condition causes a bitcell power-race condition between WLB and WL. WL decoding control circuit 130 decreases this load as explained in more detail in reference to FIG. 3.

Figure 3:
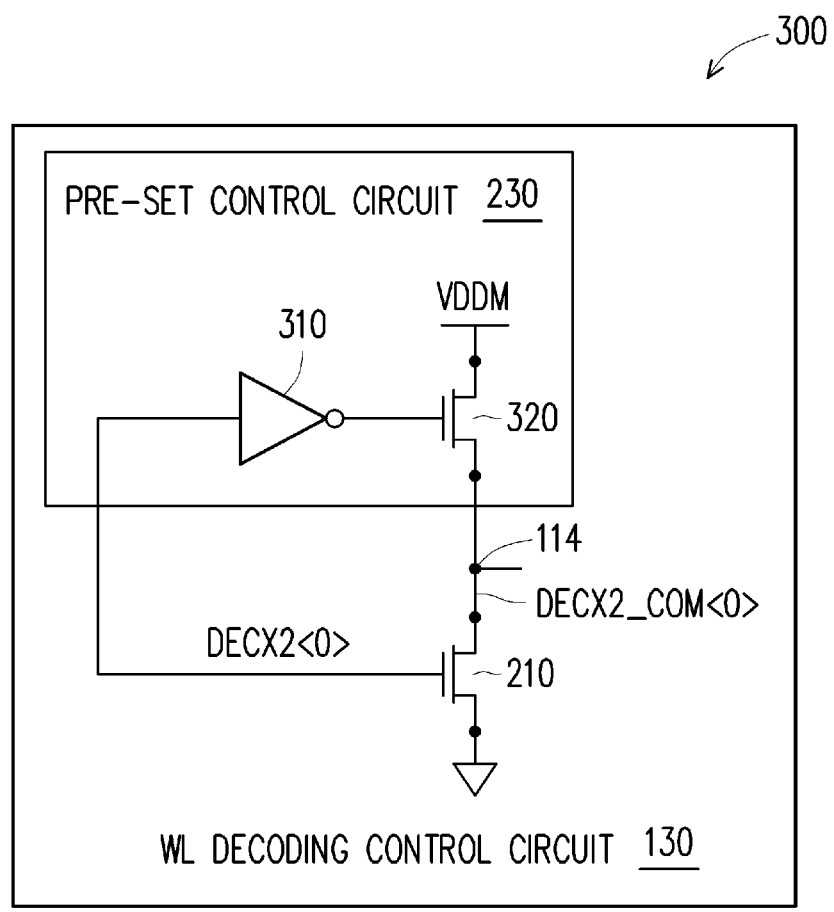
FIG. 3 depicts an example diagram of a pre-set control circuit as shown in FIG. 2 in accordance with some embodiments.

FIG. 3 depicts an example diagram 300 of a WL decoding control circuit 130 shown in FIG. 2 in accordance with some embodiments. WL decoding control circuit 130 includes an inverter 310 and NMOS transistor 320 coupled between the common node 114 and common NMOS transistor 210. In one embodiment, the input of inverter 310 is coupled to the gate region of common NMOS transistor 210. The output of inverter 310 is coupled to the gate of NMOS transistor 320. NMOS transistor 320 is driven by the supply voltage, VDDM, and inverter 310 is driven by periphery voltage, VDD. When DECX2<0> is low, the inverter 310 produces a high output to the gate terminal of NMOS transistor 320. When the periphery voltage, VDD, is greater than the supply voltage, VDDM, (e.g., VDDM=~0.54V and VDD=~0.675V in some embodiments), the voltage across the gate terminal and source terminal of NMOS transistor 320 satisfies Equations (3), (4), and/or (7) and NMOS transistor 320 is in the ON state. With the NMOS transistor 320 in the ON state, maximum current is supplied to the common node 114 (e.g., common decoder line DECX2_COM<0>) as current is flowing between the gate terminal and the source/drain terminals of NMOS transistor 320 as it is in the ON state. NMOS transistor 320 is a pull-up device that charges the RC load on DECX2_COM<0> at common node 114 when DECX2<0> is selected as it provides current to the common node 114 and a source/drain terminal of NMOS transistor 213. The common node 114 charges toward VDD at a faster rate than previously described with no pre-set control circuit 230 with NMOS transistor 210 in an OFF state, which in turn improves the charging of the WLB node. The charging of WLB improves with pre-set control circuit 230 as current is provided by both common node 114 and the source/drain terminal of NMOS 213 coupled to WLB. When the supply voltage, VDDM, is larger than the periphery supply voltage, VDD, the NMOS transistor 320 is in the ON state until common node 114 reaches the threshold voltage (e.g., VDD-$V_{TH}$) and the voltage at the common node 114 is VDD-$V_{TH}$ which would satisfy Equation (1), turning OFF NMOS transistor 320. The charging of the WLB node is relatively lesser through the common node 114 as this is a common electrical coupling point within WL decoding control circuit 130. However, a higher VDDM provides substantially sufficient electrical current for WLB to charge. With either VDDM greater than VDD or with VDD greater than VDDM, it can be observed that the WL decoding control circuit 130 automatically adjusts itself to increase the charging rate at the WLB in various VDDM/VDD voltage combinations as NMOS transistor 320 is driven by supply voltage, VDDM.

Figure 4A:
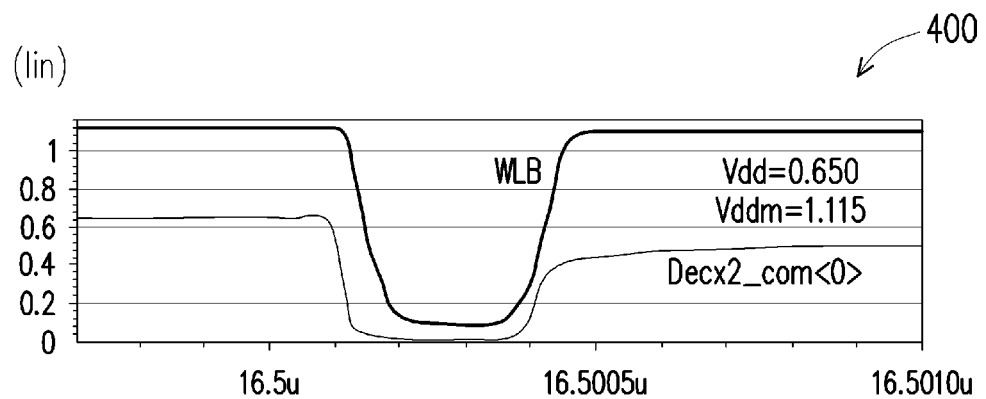
FIG. 4A-4C depict example voltage output graphs of the SRAM device shown in FIG. 3 in accordance with some embodiments.
Figure 4B:
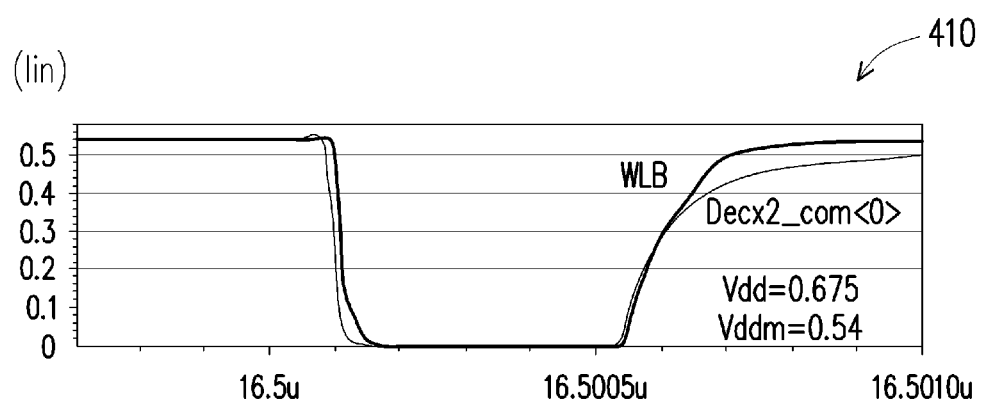
Figure 4C:
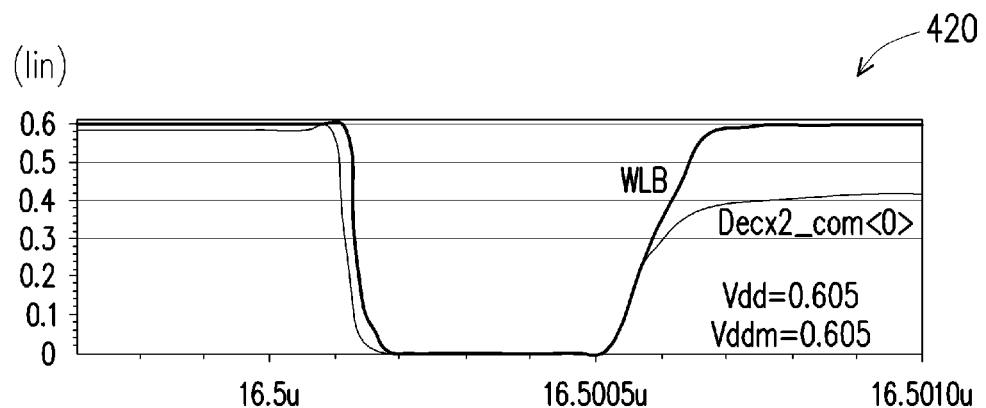

FIGS. 4A-4C depict example voltage plots of the WL decoding control circuit 130 shown in FIG. 3 in accordance with some embodiments. Referring to FIG. 4A, a supply voltage, VDDM, as illustrated as coupled to source/drain terminals of PMOS transistors 212, 214, 126 in FIG. 2 is set to 1.115 V and a periphery voltage, VDD, coupled to decoder 122 in FIG. 2 is set to 0.650 V resulting in the plot 400. Plot 400 illustrates voltage plot lines for WLB and DECX2_COM<0> at common node 114 of FIG. 2. When VDDM is greater than VDD, the voltage at the common node 114 charges to a steady state of approximately 0.4V at a charge rate which is faster than when the WLB reaches a steady state voltage above 1V and avoids the bitcell race condition. Referring to FIG. 4B, a supply voltage, VDDM, of WL decoder driver circuit 110 in FIG. 2 is set to 0.54 V and a periphery voltage, VDD, of WL pre-decoder circuit 120 in FIG. 2 is set to 0.675 V (VDD>VDDM) resulting in the plot 410. The worst case for a bitcell power race condition is when VDD is greater than VDDM as demonstrated by plot 410. Plot 410 illustrates voltage plot lines for WLB and DECX2_COM<0> at common node 114 of FIG. 2. With a smaller voltage difference between VDDM and VDD in plot 410 than in plot 400, the WLB reaches a steady state voltage at a time prior to (e.g., a point in time before) the common node 114 reaching a steady state voltage. Referring to FIG. 4C, a supply voltage, VDDM, as illustrated as coupled to source/drain terminals of PMOS transistors 212, 214, 216 in FIG. 2 is set to 0.605 V and a periphery voltage, VDD, coupled to decoder 122 in FIG. 2 is set to 0.605 V (VDD=VDDM) resulting in the plot 420. Plot 420 illustrates voltage plot lines for WLB and DECX2_COM<0> at common node 114 of FIG. 2. With equal VDD and VDDM voltage levels, the voltage at the common node 114 achieves a steady state voltage faster than WLB. Plots 400, 410, and 420 each illustrate the voltages of the WLB of WL decoder driver circuit 110 and common decoder line (e.g., DECX2_COM<0>) at common node 114 with the integration of WL decoding control circuit 130. As illustrated by plot 400, the greater the voltage gap between VDD and VDDM, the faster the WL decoding scheme 200 behaves as the steady state voltages are achieved at a faster rate in plot 400 than in plots 410, 420.

Figure 5A:
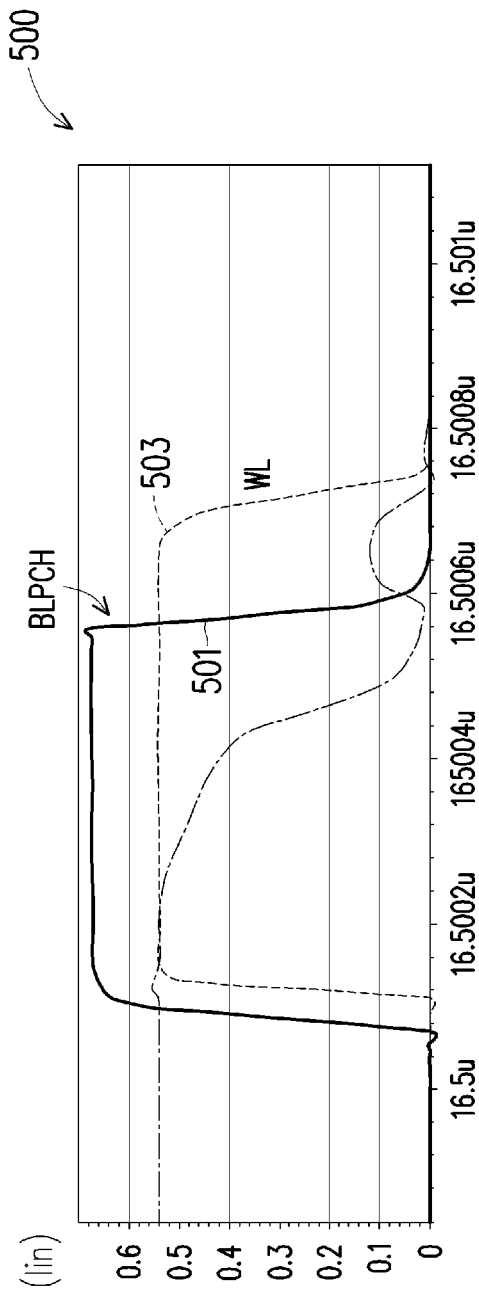
FIG. 5A depicts an example performance data plot of the WL decoding scheme shown in FIG. 2 without inclusion of pre-set control circuit.
Figure 5B:
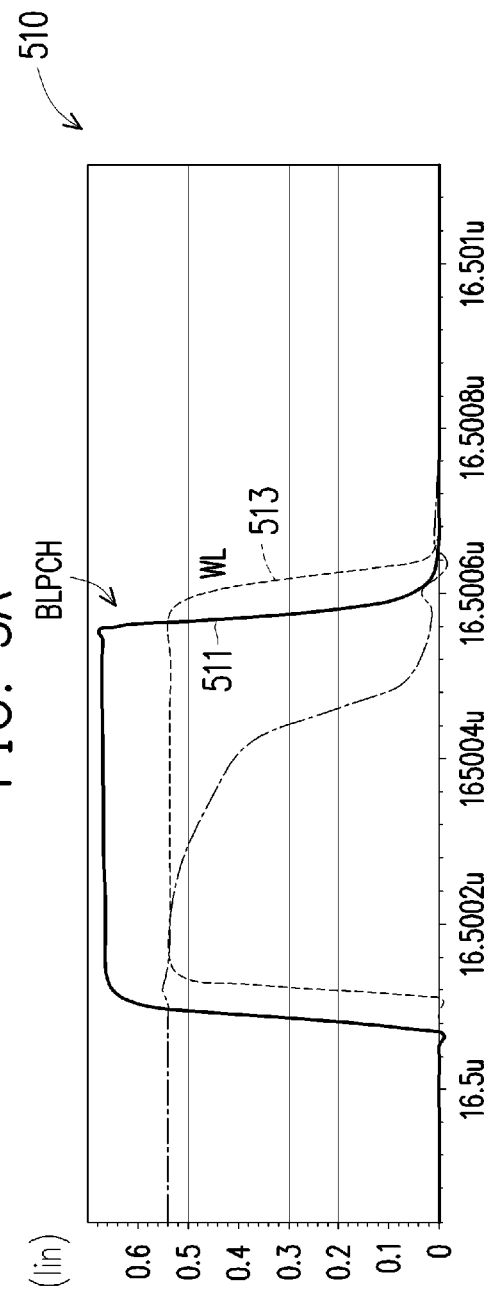
FIG. 5B depicts an example performance data plot of then WL decoding scheme shown in FIG. 2 with inclusion of pre-set control circuit as illustrated in FIG. 3.

FIG. 5A depicts an example performance data plot 500 of WL decoding scheme 200 shown in FIG. 2 without inclusion of pre-set control circuit 230. Performance data plot 500 illustrates a BLPCH voltage plot line 501 and a WL plot line 503 for a SRAM device which does not include pre-set control circuit 230. FIG. 5B depicts an example performance data plot 510 of WL decoding scheme 200 shown in FIG. 2 with inclusion of pre-set control circuit 230 as illustrated in FIG. 3. Performance data plot 510 illustrates a BLPCH voltage plot line 511 and a WL plot line 513 of a SRAM device which does include pre-set control circuit 230 as described in detail in FIG. 3. Comparing WL plot line 503 with WL plot line 513, plot 510 illustrates that use of the pre-set control circuit 230 improves the performance of a SRAM device by approximately 120 ps. In other words, use of the pre-set control circuit 230 speeds up the performance of the SRAM device so as to avoid the bitcell power race condition, ensuring that the WL pulse width is decreased between plot 500 and plot 510. In other words, the pulse width of plot line 513 was controlled via pre-set control circuit 230 (e.g., reduced pulse width between plot lime 513 and plot line 503).

Figure 6:
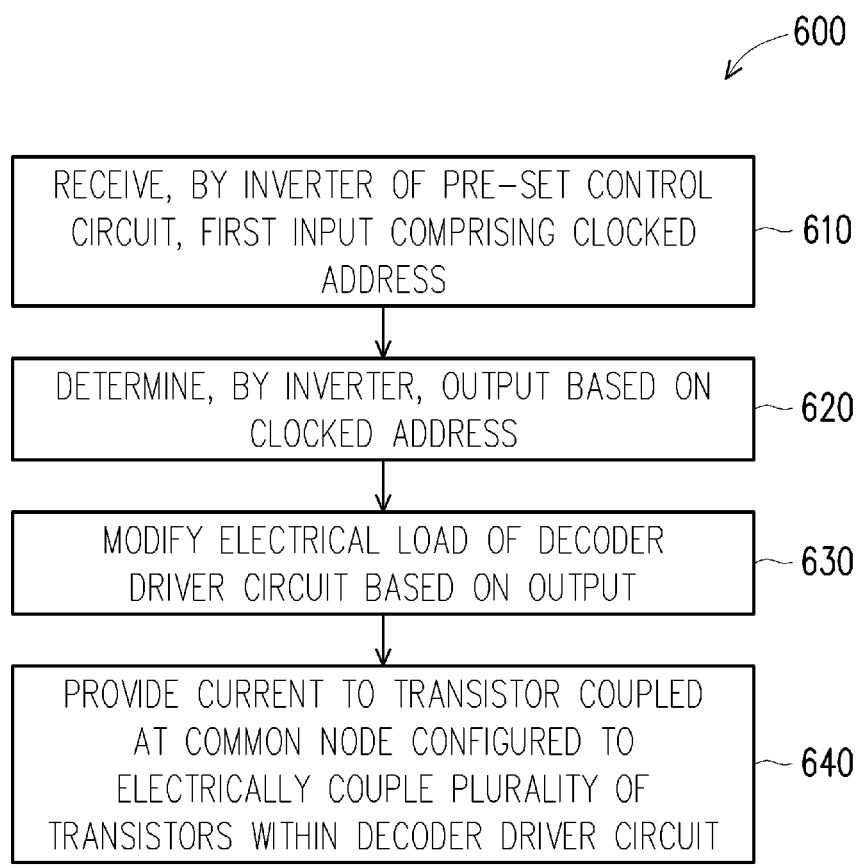
FIG. 6 depicts an example flow chart for controlling a word line pulse width of a SRAM device shown in FIG. 3 in accordance with some embodiments.

FIG. 6 depicts an example flow chart 600 depicting a process for controlling a word line pulse width of a SRAM decoding logic 100 shown in FIG. 2 in accordance with some embodiments. While the process of FIG. 6 is applicable to many different structures, it is described with reference to structures of FIGS. 1-3 for ease of understanding. An inverter 310 within pre-set control circuit 230 receives a first input including a clocked address at 610. The inverter 310 determines an output based on the clocked address input (e.g., from NMOS transistor 210) at 620. As known in the art, an inverter inverts the input provided to it. For example, if a high input is provided to inverter 310, inverter 310 will provide a low output and vice versa. An electrical load of the WL decoder driver circuit 110, as described in detail in FIG. 2, is modified based on the output of the inverter at 630. For example, the effective load as measured at common node 114 can be reduced as WL decoding control circuit 130 is used as a pull-up device to charge the RC load at common node 114. At 640, current is provided to the transistor coupled at the common node configured to electrically couple a plurality of transistors within the decoder driver circuit.

Implementation of WL decoding control circuit 130 as described herein can substantially minimize and/or eliminate power race conditions between turning OFF a WL prior to turning ON BLPCH. The worst case power race condition exists when the periphery supply voltage, VDD, is greater than the supply voltage, VDDM. The WL decoding control circuit 130 is used as a pull up device to charge an RC load at a common node 114 of the SRAM device. Reducing of the effective load measured at common node 114 can substantially minimize and/or eliminate the race condition by maintaining and/or minimizing current leakages of the SRAM device, maintaining and/or minimizing power consumed by the SRAM device, and/or maintaining and/or minimizing the time between when a WL turns OFF prior to turning ON BLPCH. In some embodiments, systems and methods as described herein can substantially minimize or eliminate power race conditions at a minimal cost in increased circuit complexity. In one example, a control circuit, as described herein, can be implemented that adds only two gates per 64 WLs of a memory device.

In one embodiment, a circuit includes a first transistor having a gate and a source/drain terminal. The circuit also includes an inverter having an input node coupled to the gate of the first transistor and an output node. The circuit also includes a second transistor having a gate and a source/drain terminal. The gate of the second transistor is coupled to the output node of the inverter. The source/drain terminal of the second transistor is coupled to the source/drain terminal of the first transistor.

In another embodiment, SRAM devices are provided having at least two decoder circuits electrically coupled together via a common decoder line, a transistor electrically coupled to the decoder line, and an inverter electrically coupled to the transistor.

In yet another embodiment, an inverter of a pre-set control circuit receives a first input including a clocked address. The inverter determines an output based on the clocked address. An electrical load of a decoder driver circuit is modified based on the output. Current is provided to a transistor coupled at a common node configured to electrically couple a plurality of transistors within the decoder driver circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be one or more third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A control circuit for minimizing a static noise margin of a static random access memory device comprising:
   a first transistor;
   an inverter having an input node coupled to a gate of the first transistor; and
   a second transistor coupled to the inverter, the first transistor, and a decoder driver circuit, wherein the second transistor is configured to charge a load of a common decoder line coupled to the first transistor and the second transistor so as to reduce an effective load of the decoder driver circuit and wherein a first source/drain terminal of the second transistor is free of connection with the input node of the inverter.

2. The control circuit of claim 1, wherein the first transistor and the second transistor are coupled together at a common node, the common node coupled to one or more driver circuits.

3. The control circuit of claim 1, wherein the first transistor is coupled to a common decoder line of a static random access memory (SRAM) device.

4. The control circuit of claim 1, wherein the inverter is driven by a first voltage and the second transistor is driven by a second voltage.

5. The control circuit of claim 4, wherein the first and second voltages are voltages independent of one another.

6. The control circuit of claim 4, wherein a second source/drain terminal of the second transistor is coupled to the second voltage.

7. A static random access memory (SRAM) device comprising:
   a decoder driver circuit;
   a first transistor electrically coupled to the decoder driver circuit via a common decoder line;
   an inverter electrically coupled to the first transistor, wherein the first transistor is configured to charge a load of the common decoder line so as to reduce an effective load of the decoder driver circuit, wherein the common decoder line is coupled to one or more second transistors within the decoder driver circuit, and wherein a first source/drain terminal of the first transistor is free of connection with an input node of the inverter; and
   a third transistor electrically coupled between the first source/drain terminal of the first transistor and the input node of the inverter.

8. The SRAM device of claim 7, wherein the inverter is driven by a first voltage and the first transistor is driven by a second voltage.

9. The SRAM device of claim 8, wherein the first and second voltages are voltages independent of one another.

10. The SRAM device of claim 8, wherein a second source/drain terminal of the first transistor is coupled to the second voltage.

11. The SRAM device of claim 7, wherein the input node of the inverter comprises an input node is electrically coupled to a gate of the third transistor.

12. A method in a static random access memory (SRAM) device comprising:
    generating a first input comprising a clocked address;
    receiving, by an inverter, the clocked address;
    generating, by the inverter, an output based on the clocked address;
    modifying an electrical load of a decoder driver circuit of the SRAM device based on the output; and
    receiving, by a gate of a transistor, the output generated by the inverter to generate the electrical load at a first source/drain terminal of the transistor.

13. The method of claim 12, wherein the transistor is configured to charge the electrical load of the decoder driver circuit so as to reduce an effective load of the decoder driver circuit.

14. The method of claim 12, wherein a common decoder line is coupled to one or more transistors of the decoder driver circuit.

15. The method of claim 12, wherein the inverter is driven by a first voltage and the transistor is driven by a second voltage.

16. The method of claim 15, wherein the first and second voltages are voltages independent of one another.

17. The method of claim 15, wherein a second source/drain terminal of the transistor is coupled to the second voltage.

18. The method of claim 15, wherein the electrical load is reduced at the first source/drain of the transistor when the first voltage is greater than the second voltage.

19. The control circuit of claim 1, wherein an output node of the inverter is coupled to a gate of the second transistor.

20. The SRAM device of claim 7, wherein an output node of the inverter is coupled to a gate of the first transistor.

* * * * *